United States Patent
Fan et al.

(10) Patent No.: US 7,951,624 B2
(45) Date of Patent: May 31, 2011

(54) METHOD OF MANUFACTURING LIGHT EMITTING DIODE

(75) Inventors: Ben Fan, He Shan (CN); Hsin-Chuan Weng, He Shan (CN); Kuo-Kuang Yeh, He Shan (CN)

(73) Assignee: He Shan Lide Electronic Enterprise Company Ltd., He Shan, Guangdong (CN)

( * ) Notice: Subject to any disclaimer, the term of this patent is extended or adjusted under 35 U.S.C. 154(b) by 226 days.

(21) Appl. No.: 12/320,020

(22) Filed: Jan. 15, 2009

(65) Prior Publication Data
US 2009/0246899 A1 Oct. 1, 2009

(30) Foreign Application Priority Data
Mar. 27, 2008 (CN) .......................... 2008 1 0027086

(51) Int. Cl.
*H01L 21/00* (2006.01)
(52) U.S. Cl. ................ 438/27; 438/22; 438/25; 438/45; 438/47; 257/72; 257/79; 257/82; 257/94; 257/96; 257/E33.068
(58) Field of Classification Search .................. None
See application file for complete search history.

(56) References Cited

U.S. PATENT DOCUMENTS
7,087,933 B2 * 8/2006 Takeda et al. .................. 257/94
* cited by examiner

*Primary Examiner* — N Drew Richards
*Assistant Examiner* — Kyoung Lee
(74) *Attorney, Agent, or Firm* — Posz Law Group, PLC

(57) ABSTRACT

A method of manufacturing light emitting diode has steps of providing a package base, providing a light emitting structure and bonding the light emitting structure on the package base. The package base has a first metal layer and a second metal layer respectively formed on a top and a bottom thereon. The light emitting structure has a substrate, a light emitting lamination and a reflective metal layer. The light emitting lamination is formed on the substrate and has an n-type semiconductor layer, a light emitting layer, a p-type semiconductor layer and a transparent electrode layer deposited on the substrate in sequence. The reflective metal layer is formed on a bottom of the substrate. The first metal layer is connected to the reflective metal layer by an ultrasonic thermal press technique. Therefore, the thermal resistance of the finished LED reduces.

7 Claims, 3 Drawing Sheets

METHOD OF MANUFACTURING LIGHT EMITTING DIODE

BACKGROUND OF THE INVENTION

1. Field of the Invention

The present invention relates to a method, and more particularly to a method of manufacturing a light emitting diode with an ultrasonic thermal press technique.

2. Description of Related Art

Conventional method of manufacturing light emitting diodes (LEDs) is to form monocrystalline materials as a light emitting structure on a substrate. Different substrates and light emitting structures result in different colors of the light beam produced by the LED. For example, blue LED is made of indium gallium nitride (InGaN) light emitting structure on a sapphire substrate. Because the sapphire substrate is electronically insulated, positive and negative electrodes must face up and be formed on the blue LED. Accordingly, after manufacturing the wafer on the substrate, steps of forming electrodes, etching the negative electrode area, exposing and cleaning surfaces of the die, detecting characteristics of the emitted light, cutting the die, bonding the die, bonding wires on the die, glue-injecting and the like are still have to be finished subsequently.

Conventional packaging technique usually uses either silver glues or insulating glues to bond the die. However, a common drawback of the silver glue and the insulating glue is that their thermal conductivities are not good. For example, thermal conductivity of the silver glue or the insulating glue is between 0.1 W/mK to 4 W/mK. Therefore, when the LED is used to an application that requires lager power, such as illuminating, the glue having low thermal conductivity results in low illumination and short lifetime. Consequently, a material with high thermal conductivity for bonding the die is required.

To overcome the shortcomings, the present invention provides a method of manufacturing a light emitting diode to mitigate or obviate the aforementioned problems.

SUMMARY OF THE INVENTION

The main objective of the invention is to provide a method of manufacturing a light emitting diode (LED) of a normal structure. The method in accordance with the present invention comprises steps of providing a package base, providing a light emitting structure and bonding the light emitting structure on the package base with an ultrasonic thermal press technique. In the step of providing a package base, the package base has a first metal layer and a second metal layer respectively formed on a top and a bottom thereon. In the step of providing a light emitting structure, the light emitting structure comprises a substrate, a light emitting lamination and a reflective metal layer. The light emitting lamination is formed on the substrate and comprises an n-type semiconductor layer, a light emitting layer, a p-type semiconductor layer and a transparent electrode layer deposited on the substrate in sequence. The reflective metal layer is formed on a bottom of the substrate. In the step of bonding the light emitting structure on the package base with an ultrasonic thermal press technique, the first metal layer on the package base is connected to the reflective metal layer on the bottom of the substrate of the light emitting structure.

Another main objective of the invention is to provide a method of manufacturing a light emitting diode of a vertical structure. The method in accordance with the present invention comprises steps of providing a package base, providing a light emitting structure and bonding the light emitting structure on the package base with an ultrasonic thermal press technique. In the step of providing a package base, the package base has a first metal layer and a second metal layer formed respectively on a top and a bottom thereon. In the step of providing a light emitting structure, the light emitting structure comprises a metal substrate, a third metal layer, a fourth metal layer and a light emitting lamination. The third metal layer is formed on a top of the metal substrate. The fourth metal layer is formed on a bottom of the metal substrate. The light emitting lamination is formed on the third metal layer on the top of the metal substrate and comprises a p-type semiconductor layer, a light emitting layer and an n-type semiconductor layer deposited on the metal substrate in sequence. In the step of bonding the light emitting structure on the package base with an ultrasonic thermal press technique, the first metal layer on the package base is connected to the fourth metal layer on the bottom of the metal substrate of the light emitting structure.

The other main objective of the invention is to provide a method of manufacturing a light emitting diode of a flip chip structure. The method in accordance with the present invention comprises steps of providing a package base, providing a light emitting structure and bonding the light emitting structure on the package base with an ultrasonic thermal press technique. In the step of providing a package base, the package base has a first metal layer and a second metal layer formed respectively on a top and a bottom thereon. In the step of providing a light emitting structure, the light emitting structure comprises a substrate, a third metal layer, a fourth metal layer, a fifth metal layer, a p-type reflective metal layer and a light emitting lamination. The third metal layer and the fourth metal layer are formed on a top of the substrate and are isolated with each other. The fifth metal layer is formed on a bottom of the substrate. The p-type reflective metal layer is formed on the third metal layer. The light emitting lamination is formed on the p-type reflective metal layer and comprises a p-type semiconductor layer, a light emitting layer and an n-type semiconductor layer deposited on the p-type reflective metal layer in sequence. In the step of bonding the light emitting structure on the package base with an ultrasonic thermal press technique, the first metal layer on the package base is connected to the fifth metal layer on the bottom of the substrate of the light emitting structure.

Preferably, each of the metal layers respectively on the top of the package base and the bottom of the substrate in the light emitting structure may be composed of the metal that will be transferred to low-temperature eutectic phase during thermal pressing.

Preferably, the transparent electrode layer may be composed of the material that is selected from the group consisting of indium tin oxide (ITO), $RuO_2$, ZnO, NiO and combinations. Each of the p-type semiconductor layer, the light emitting layer and the n-type semiconductor layer may be composed of GaN, InGaN or AlInGaP. Each of the metal layers on the light emitting structure may be composed of the material that is selected from the group consisting of Al, Ag, Pt, Cr, Mo, W, Au and combinations.

Preferably, the package base may be composed of the material that has good thermal conductivity, such as selected from the group consisting of silicon, aluminum, copper, wolfram, molybdenum, gallium nitride, aluminum nitride, silicon carbide and combinations. Each of the metal layers on the package base may be composed of the material that is selected from the group consisting of Al, Ag, Pt, Cr, Mo, W, Au and combinations.

Because the method of the present invention uses the ultrasonic thermal press technique to bond the light emitting structure to the package base, using material having high thermal conductivity to be the metal layers for connecting the light emitting structure and the package base together is allowable. Therefore, the thermal resistance of the finished LED reduces. Consequently, the LED will not overheat even it is driven under a high current.

Other objectives, advantages and novel features of the invention will become more apparent from the following detailed description when taken in conjunction with the accompanying drawings.

DETAILED DESCRIPTION OF PREFERRED EMBODIMENT

First Embodiment

Figure 1:
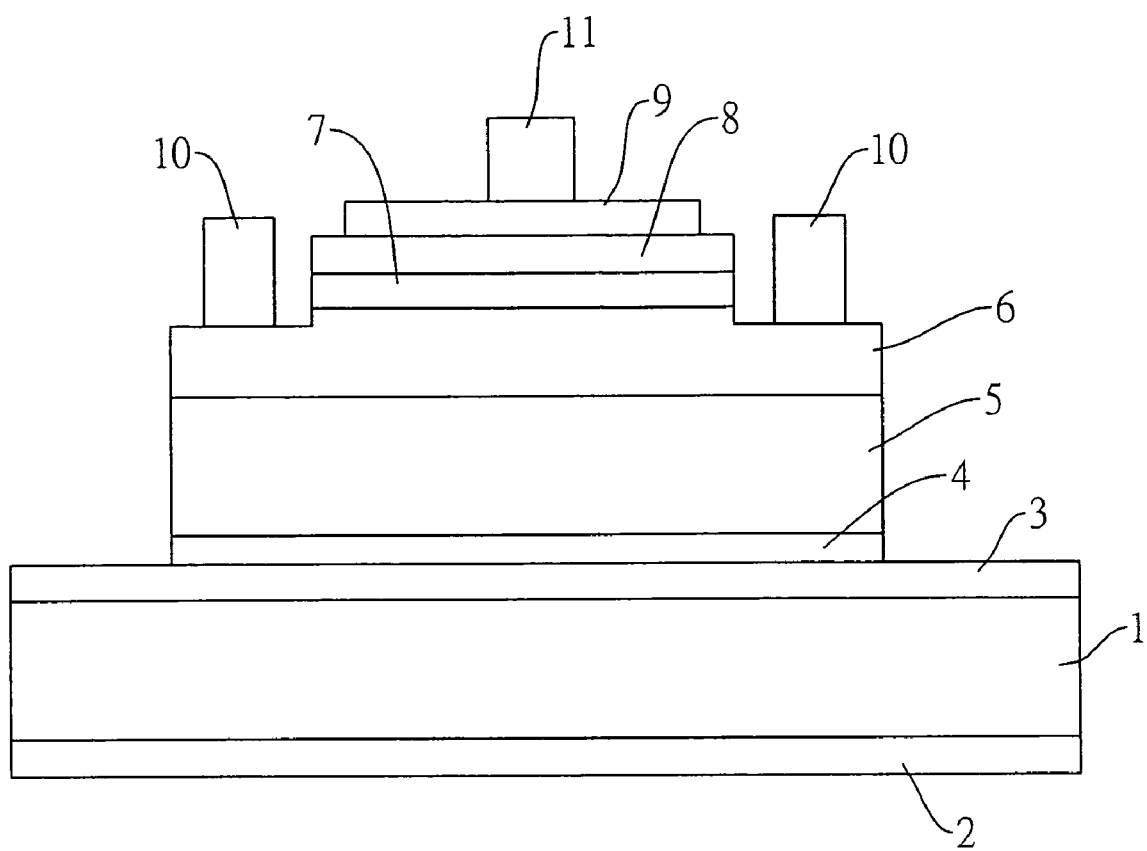
FIG. 1 is a side view in cross section of a light emitting diode of a normal structure manufactured by a first embodiment of a method in accordance with the present invention.

With reference to FIG. 1, a light emitting diode (LED) of a normal structure is manufactured by a first embodiment of a method in accordance with the present invention. The LED comprises a sapphire substrate (5) and a package base (1). An n-type semiconductor layer (6), a light emitting layer (7), a p-type semiconductor layer (8) and a transparent electrode layer (9) are formed on the top of the sapphire substrate (5) in sequence. A p-type metal electrode (11) and an n-type metal electrode (10) are formed respectively on the transparent electrode layer (9) and the n-type semiconductor (gallium nitride) layer (6). A reflective metal layer (4) is formed on the bottom of the sapphire substrate (5). The package base (1) has a top, a bottom, a first metal layer (3) and a second metal layer (2). The first metal layer (3) is formed on the top of the package base (1). The second metal layer (2) is formed on the bottom of the package base (1) and is used to connect to other external apparatus.

The reflective metal layer (4) is connected to the first metal layer (3) on the top of the package base (1) by an ultrasonic thermal press technique under temperature lower than 200 degrees centigrade. Because of using the ultrasonic thermal press technique, the first metal layer (3) on the top of the package base (1) and the reflective metal layer (4) on the bottom of the sapphire substrate (5) can be made of metals having high thermal conductivities to reduce the thermal resistance of the finished LED.

Each of the first metal layer (3) and the reflective metal layer (4) may be composed of the metal that will be transferred to low-temperature eutectic phase during-thermal pressing to further reduce the temperature during ultrasonic thermal pressing the package base (1) and the sapphire substrate (5).

The transparent electrode layer (9) may be composed of the material that is selected from the group consisting of indium tin oxide (ITO), $RuO_2$, ZnO, NiO and combinations. Each of the p-type semiconductor layer (8), the light emitting layer (7) and the n-type semiconductor layer (6) may be composed of GaN, InGaN or AlInGaP. The reflective metal layer (4) may be composed of the material that is selected from the group consisting of Al, Ag, Pt, Cr, Mo, W, Au and combinations.

In addition, the package base (1) may be composed the material with good thermal conductivity, such as selected from the group consisting of silicon, aluminum, copper, wolfram, molybdenum, gallium nitride, aluminum nitride, silicon carbide and combinations. Each of the first and the second metal layers (3, 2) respectively on the top and the bottom of the package base (1) may be composed of the material that is selected from the group consisting of Al, Ag, Pt, Cr, Mo, W, Au and combinations.

Therefore, the first embodiment of the method in accordance with the present invention comprises steps of providing a package base, providing a light emitting structure comprising a substrate, a light emitting lamination and a reflective metal layer and bonding the light emitting structure on the package base with an ultrasonic thermal press technique.

Second Embodiment

Figure 2:
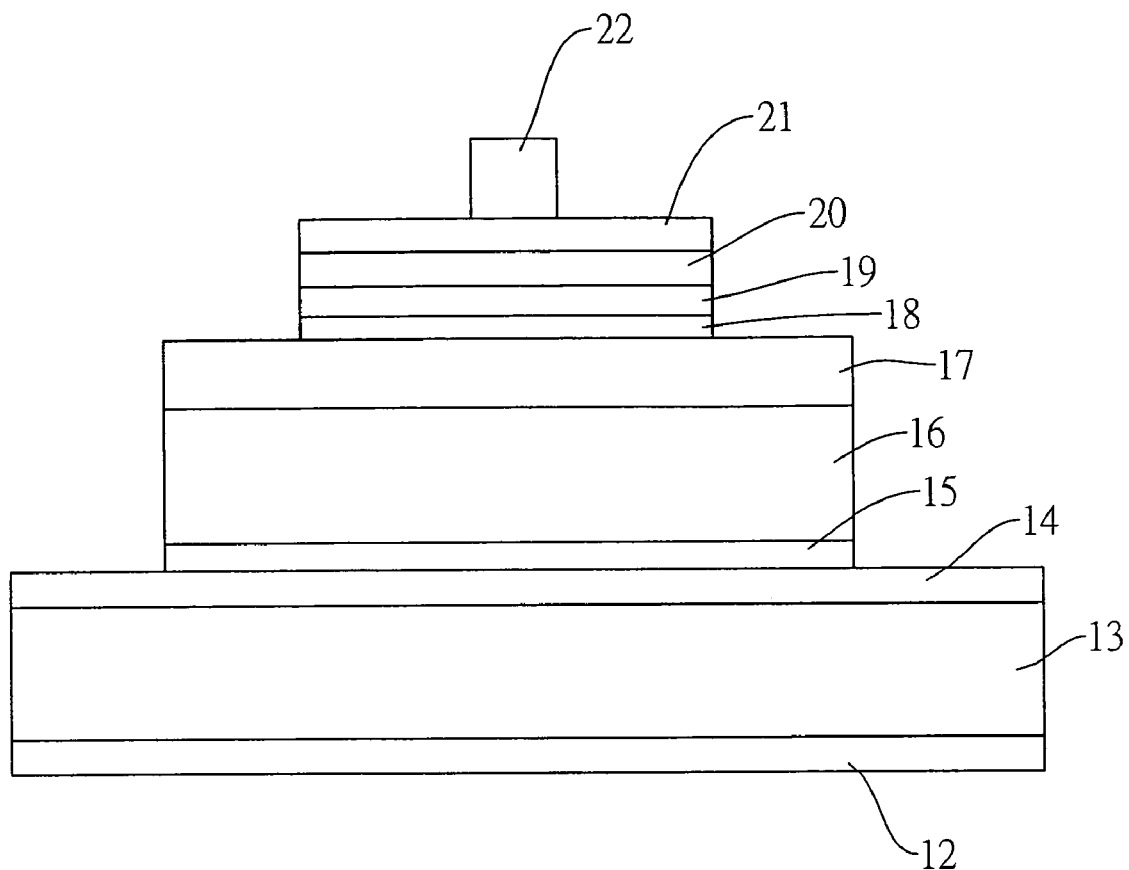
FIG. 2 is a side view in cross section of a light emitting diode of a vertical structure manufactured by a second embodiment of the method in accordance with the present invention.

With reference to FIG. 2, an LED of a vertical structure is manufactured by a second embodiment of the method in accordance with the present invention. The LED comprises a metal substrate (16) and a package base (13). The metal substrate (16) has a top, a bottom, a third metal layer (17) and a fourth metal layer (18). The third metal layer (17) is formed on the top of the metal substrate (16) and functions as an electrode. The fourth metal layer (18) is formed on the bottom of the metal substrate (16). The package base (13) has a top, a bottom, a first metal layer (14) and a second metal layer (12). The first metal layer (14) is formed on the top of the package base (13). The second metal layer (12) is formed on the bottom of the package base (13) and is used to connect to other external apparatus.

A reflective metal layer (18), a p-type semiconductor layer (19), a light emitting layer (20), an n-type semiconductor layer (21) and an n-type metal electrode (22) are bonded on the third metal layer (17) in sequence. Furthermore, the reflective metal layer (18) may be omitted if required. Additionally, a transparent metal electrode may be formed between the n-type metal electrode (22) and the n-type semiconductor layer (21) if required.

The fourth metal layer (15) formed on the bottom of the metal substrate (16) is connected to the first metal layer (14) on the top of the package base (13) by the ultrasonic thermal press technique under temperature lower than 200 degrees centigrade.

Because of using the ultrasonic thermal press technique, the first metal layer (14) on the top of the package base (13) and the fourth metal layer (15) on the bottom of the metal substrate (15) can be made of metals having high thermal conductivities to reduce the thermal resistance of the finished LED.

Each of the first metal layer (14) and the reflective metal layer (15) may be composed of the metal that will be transferred to low-temperature eutectic phase during thermal pressing to further reduce the temperature during ultrasonic thermal pressing the package base (13) and the metal substrate (16).

Each of the p-type semiconductor layer (19), the light emitting layer (20) and the n-type semiconductor layer (21) may be composed of GaN, InGaN or AlInGaP. The fourth metal layer (15) may be composed of the material that is selected from the group consisting of Al, Ag, Pt, Cr, Mo, W, Au and combinations.

In addition, the package base (13) may be composed the material that has good thermal conductivity, such as selected from the group consisting of silicon, aluminum, copper, wolfram, molybdenum, gallium nitride, aluminum nitride, silicon carbide and combinations. Each of the first and the second metal layers (14, 12) respectively on the top and the bottom of the package base (13) may be composed of the material that is selected from the group consisting of Al, Ag, Pt, Cr, Mo, W, Au and combinations.

Therefore, the second embodiment of the method in accordance with the present invention comprises steps of providing a package base, providing a light emitting structure comprising a metal substrate, a third metal layer, a fourth metal layer and a light emitting lamination and bonding the light emitting structure on the package base with an ultrasonic thermal press technique.

Third Embodiment

Figure 3:
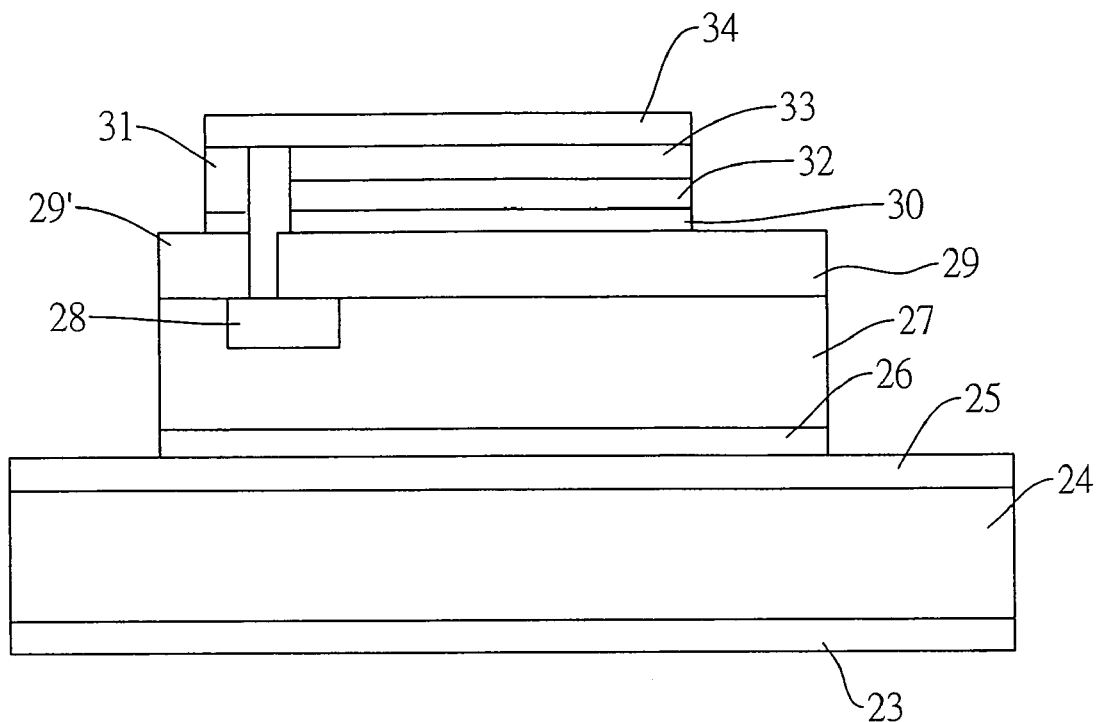
FIG. 3 is a side view in cross section of a light emitting diode of a flip chip structure manufactured by a third embodiment of the method in accordance with the present invention.

With reference to FIG. 3, a light emitting diode (LED) of a flip chip structure is manufactured by a third embodiment of a method in accordance with the present invention. The LED comprises a substrate (27) and a package base (24). The substrate (27) has a top and a bottom. A metal layer is formed on the top of the substrate (27) and is patterned to form a third metal layer (29) and a fourth metal layer (29'). The third metal layer (29) functions as an electrode. A fifth metal layer (26) is formed on the bottom of the substrate (27). The package base (24) has a top and a bottom. A first metal layer (25) is formed on the top of the package base (24). A second metal layer (23) is formed on the bottom of the package base (24) and is used to connect to other external apparatus.

A p-type reflective metal layer (30), a p-type semiconductor layer (32), a light emitting layer (33) and an n-type semiconductor layer (34) are bonded on the third metal layer (29) in sequence. An n-type metal electrode (31) is between the fourth metal layer (29') and the n-type semiconductor layer (34). A zenor diode (28) is formed in the substrate (27) and is connected between the third metal layer (29) and the fourth metal layer (29').

The fifth metal layer (26) on the bottom of the substrate (27) is connected to the first metal layer (25) on the top of the package base (24) by the ultrasonic thermal press technique under temperature lower than 200 degrees centigrade.

Because of using the ultrasonic thermal press technique, the first metal layer (25) on the top of the package base (24) and the fifth meal layer (26) on the bottom of the substrate (27) can be made of metals having high thermal conductivities to reduce the thermal resistance of the finished LED.

Each of the first metal layer (25) and the fifth metal layer (26) may be composed of the metal that will be transferred to low-temperature eutectic phase during thermal pressing to further reduce the temperature during ultrasonic thermal pressing the package base (24) and the substrate (27).

Each of the p-type semiconductor layer (32), the light emitting layer (33) and the n-type semiconductor layer (34) may be composed of GaN, InGaN or AlInGaP. The fifth metal layer (26) may be composed of the material that is selected from the group consisting of Al, Ag, Pt, Cr, Mo, W, Au and combinations.

In addition, the package base (24) may be composed the material that has good thermal conductivity, such as selected from the group consisting of silicon, aluminum, copper, wolfram, molybdenum, gallium nitride, aluminum nitride, silicon carbide and combinations. Each of the first and the second metal layers (25, 23) respectively on the top and the bottom of the package base (24) may be composed of the material that is selected from the group consisting of Al, Ag, Pt, Cr, Mo, W, Au and combinations.

Therefore, the third embodiment of the method in accordance with the present invention comprises steps of providing a package base, providing a light emitting structure comprising a substrate, a third metal layer, a fourth metal layer, a fifth metal layer, a p-type reflective metal layer and a light emitting lamination and bonding the light emitting structure on the package base with an ultrasonic thermal press technique.

Because the method of the present invention uses the ultrasonic thermal press technique to bond the light emitting structure to the package base, the metal layers for boding the light emitting structure to the package base can be composed of the material with high thermal conductivity. Therefore, the thermal resistance of the finished LED reduces, and the LED will not overheat even a high current flows through the LED. Consequently, the light emitting area of the light emitting structure is enlarged, for example, 1 mm×1 mm or 1.5 mm×1.5 mm. Moreover, a larger operating current such as in the range between 500 mA and 700 mA is acceptable. The operating power can approach to 3 W or more.

Even though numerous characteristics and advantages of the present invention have been set forth in the foregoing description, together with details of the structure and function of the invention, the disclosure is illustrative only. Changes may be made in detail, especially in matters of arrangement of parts within the principles of the invention to the full extent indicated by the broad general meaning of the terms in which the appended claims are expressed.

What is claimed is:

1. A method of manufacturing light emitting diode (LED) of a normal structure comprising steps of:
   providing a package base having
      a top;
      a bottom;
      a first metal layer being formed on the top of the package base; and
      a second metal layer being formed on the bottom of the package base;
   providing a light emitting structure comprising
      a substrate having a bottom;
      a light emitting lamination being formed on the substrate and comprising an n-type semiconductor layer, a light emitting layer, a p-type semiconductor layer and a transparent electrode layer deposited on the substrate in sequence; and
      a reflective metal layer being formed on the bottom of the substrate; and
   bonding the light emitting structure on the package base with an ultrasonic thermal press technique to connect the first metal layer to the reflective metal layer.

2. The method as claimed in claim 1, wherein each of the first metal layer and the reflective metal layer is composed of the metal that is transferred to low-temperature eutectic phase during thermal pressing.

3. The method as claimed in claim 1, wherein the transparent electrode layer is composed of the material that is selected from the group consisting of indium tin oxide, $RuO_2$, ZnO, NiO and combinations.

4. The method as claimed in claim 1, wherein each of the p-type semiconductor layer, the light emitting layer and the n-type semiconductor layer is composed of GaN, InGaN or AlInGaP.

5. The method as claimed in claim 1, wherein the reflective metal layer is composed of the material that is selected from the group consisting of Al, Ag, Pt, Cr, Mo, W, Au and combinations.

6. The method as claimed in claim 1, wherein the package base is composed of the material that has good thermal conductivity and is selected from the group consisting of silicon, aluminum, copper, wolfram, molybdenum, gallium nitride, aluminum nitride, silicon carbide and combinations.

7. The method as claimed in claim 1, wherein each of the first and the second metal layers on the package base is composed of the material that is selected from the group consisting of Al, Ag, Pt, Cr, Mo, W, Au and combinations.

* * * * *